(12) United States Patent
Ohkawa et al.

(10) Patent No.: US 9,689,926 B2
(45) Date of Patent: Jun. 27, 2017

(54) BATTERY CONTROLLING USING CHARGE STATE CALCULATOR AND CHARGE STATE VERIFIER

(71) Applicant: HITACHI AUTOMOTIVE SYSTEMS, LTD., Ibaraki (JP)

(72) Inventors: Keiichiro Ohkawa, Ibaraki (JP); Ryohei Nakao, Tokyo (JP); Youhei Kawahara, Tokyo (JP); Naoyuki Igarashi, Ibaraki (JP); Yoshinori Aoshima, Ibaraki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 216 days.

(21) Appl. No.: 14/648,400

(22) PCT Filed: Jan. 25, 2013

(86) PCT No.: PCT/JP2013/051543
§ 371 (c)(1),
(2) Date: May 29, 2015

(87) PCT Pub. No.: WO2014/115294
PCT Pub. Date: Jul. 31, 2014

(65) Prior Publication Data
US 2015/0301115 A1    Oct. 22, 2015

(51) Int. Cl.
*G01N 27/416*    (2006.01)
*H02J 7/00*    (2006.01)
(Continued)

(52) U.S. Cl.
CPC ..... *G01R 31/3637* (2013.01); *G01R 31/3651* (2013.01); *H02J 7/0021* (2013.01);
(Continued)

(58) Field of Classification Search
CPC .......... G01R 19/16542; G01R 31/3631; G01R 31/3658; G01R 31/3682; G01R 31/3637;
(Continued)

(56) References Cited

U.S. PATENT DOCUMENTS

2005/0237024 A1    10/2005    Hogari et al.
2008/0053715 A1    3/2008    Suzuki et al.
(Continued)

FOREIGN PATENT DOCUMENTS

JP    11-223665 A1    8/1999
JP    2005-315730 A    11/2005
(Continued)

OTHER PUBLICATIONS

Japanese Office Action for JP 2014-558377 dated Feb. 2, 2016, 3 pages.

*Primary Examiner* — Yalkew Fantu
*Assistant Examiner* — Mohammed J Sharief
(74) *Attorney, Agent, or Firm* — Volpe and Koenig, P.C.

(57) ABSTRACT

The purpose of the present invention is to provide a battery control device that can appropriately verify the results of the estimation of the state of charge of a battery. This battery control device is provided with a charged state calculation unit that calculates the state of charge of the battery and a charged state verification unit that verifies the results of the calculation. The charged state verification unit calculates the charged state using a calculation procedure that is not being used by the charged state calculation unit.

10 Claims, 6 Drawing Sheets

(51) Int. Cl.
  *G08B 21/00* (2006.01)
  *G01R 31/36* (2006.01)
  *H01M 10/052* (2010.01)
(52) U.S. Cl.
  CPC .......... *H02J 7/0022* (2013.01); *H02J 7/0077* (2013.01); *G01R 31/3624* (2013.01); *H01M 10/052* (2013.01); *H01M 2220/20* (2013.01); *H02J 7/0014* (2013.01); *Y02E 60/122* (2013.01); *Y02T 10/7055* (2013.01)
(58) Field of Classification Search
  CPC .......... G01R 31/3651; G01R 31/3624; G01R 31/3648; G01R 31/3662; Y02E 60/12; Y02E 60/122; H02J 7/0021; H02J 7/0022; H02J 7/0077; H02J 7/0014; H02J 7/0078; H02J 7/0031; H02J 7/008; H02J 7/0047; H01M 10/052; H01M 2220/20; H01M 10/48; Y02T 10/7055; G08B 29/181

USPC .......... 320/149; 340/636.1; 702/63; 324/429
See application file for complete search history.

(56) References Cited

U.S. PATENT DOCUMENTS

| | | |
|---|---|---|
| 2010/0244886 A1 | 9/2010 | Kawahara et al. |
| 2012/0056591 A1* | 3/2012 | Abe .................. H01M 10/3909 320/132 |
| 2015/0112619 A1* | 4/2015 | Takahashi ............ H01M 10/48 702/63 |

FOREIGN PATENT DOCUMENTS

| | | |
|---|---|---|
| JP | 2008-064496 A | 3/2008 |
| JP | 2009-300362 A | 12/2009 |
| JP | 2010-256323 A | 11/2010 |
| JP | 2012-245879 A1 | 12/2012 |

* cited by examiner

BATTERY CONTROLLING USING CHARGE STATE CALCULATOR AND CHARGE STATE VERIFIER

TECHNICAL FIELD

The present invention relates to techniques for controlling batteries.

BACKGROUND ART

Vehicles that run using electricity as power equip rechargeable batteries such as lead batteries, nickel-metal hydride batteries, or lithium ion batteries. These rechargeable batteries supply electric power that is required by hybrid cars or electric cars when running. In order to control the operation of rechargeable batteries, it is necessary to calculate the state of charge (SOC) of the battery and to appropriately control charging/discharging electric currents on the basis of the calculated value.

Patent Literature 1 listed below describes a technique that calculates states of charge of batteries considering polarization voltages. Patent Literature 2 listed below describes, as a technique for reducing the risk of decrease in accuracy for calculating SOC, a method for keeping a difference between a prior SOC and a current SOC within a variation limiting value SOCL.

CITATION LIST

Patent Literature

Patent Literature 1: JP Patent Publication (Kokai) 2008-064496 A
Patent Literature 2: JP Patent Publication (Kokai) 2009-300362 A

SUMMARY OF INVENTION

Technical Problem

SOC of battery is estimated by calculation. Thus the accuracy of estimation may be decreased depending on the estimating method. The methods described in Patent Literatures 1 and 2 above attempt to improve the accuracy of estimation as far as possible. However, there are various types of methods for estimating SOC and thus the estimating methods described in those documents may not be the best.

It is conceivable to verify the estimated result in some way under the assumption that the estimating method itself may not be the best. However, even after verifying the estimated result by performing the same estimating method for a plurality of times, the verified result may include errors if the estimating method itself includes some defects. Therefore, such verifying method is insufficient.

The present invention is made to solve the above-described technical problems. It is an objective of the present invention to provide a battery control device that is capable of appropriately verifying the estimated result of state of charge of battery.

Solution to Problem

A battery control device according to the present invention comprises a charge state calculator that calculates a state of charge of a battery and a charge state verifier that verifies a calculation result of the charge state calculator. The charge state verifier calculates the state of charge using a calculation method that is not being used by the charge state calculator.

Advantageous Effects of Invention

With the battery control device according to the present invention, it is possible to, by calculating states of charge using different calculating methods, mutually verify the calculated results between the plurality of calculating methods to improve the reliability of the calculated results.

DESCRIPTION OF EMBODIMENTS

Hereinafter, embodiments of the present invention will be described with reference to Figures. The embodiments below will be described with examples where the present invention is applied to a battery system that implements an electric power of a plug-in hybrid electric vehicle (PHEV).

The embodiments below will be described with examples where lithium ion batteries are employed. However, batteries such as nickel-metal hydride batteries, lead batteries, electric doubled layer capacitors, or hybrid capacitors may be used. In the embodiments below, assembled batteries are implemented by serially connecting cell batteries. However, the assembled battery may be implemented by serially connecting sets of cell batteries that are connected with each other in parallel or by connecting sets of cell batteries in parallel that are connected with each other serially.

Embodiment 1

System Configuration

Figure 1:
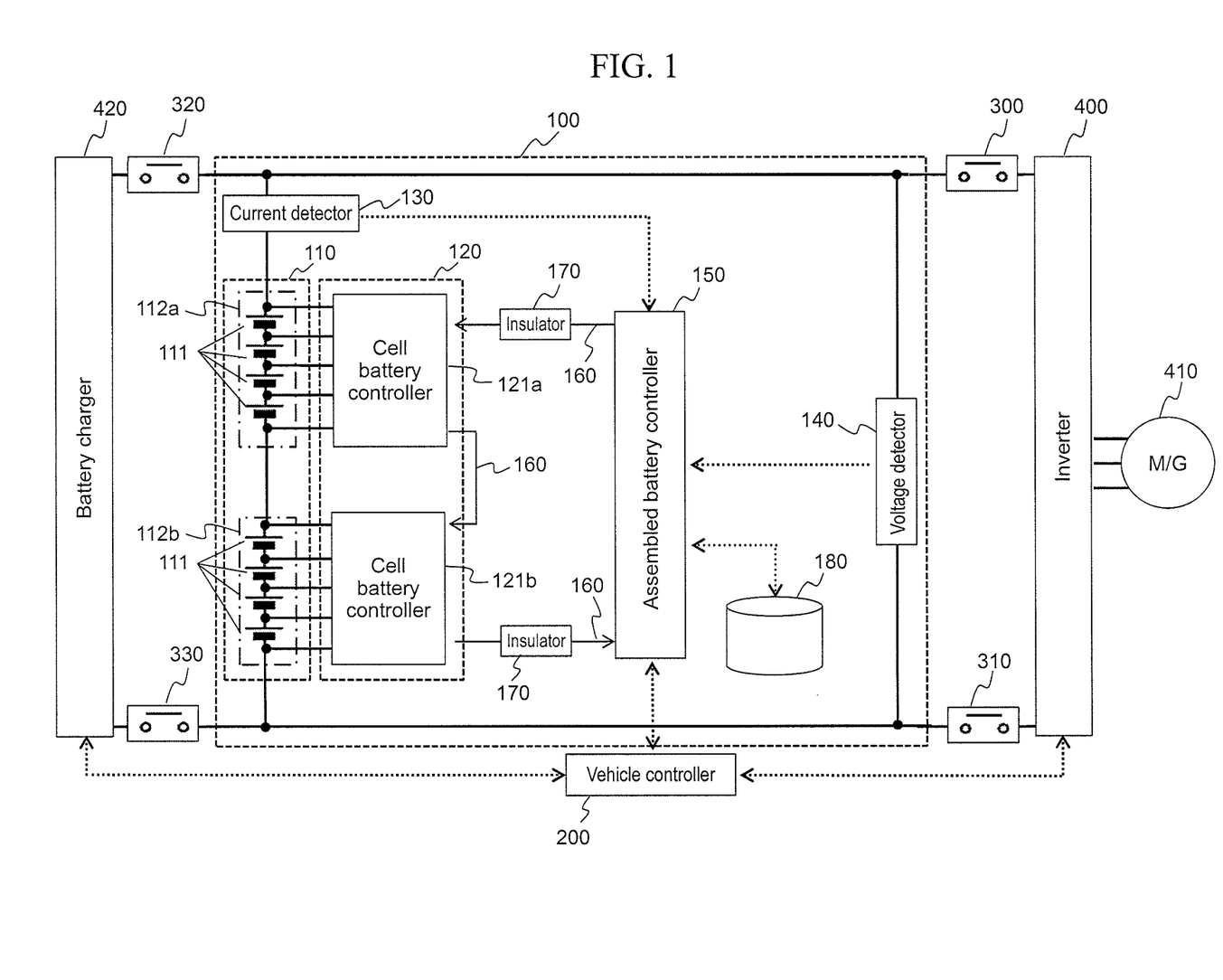
FIG. 1 is a diagram showing a configuration of a battery system 100 according to an embodiment 1 and its peripheral configurations.

FIG. 1 is a diagram showing a configuration of a battery system 100 according to an embodiment 1 of the present invention and its peripheral configurations. The battery system 100 is connected to an inverter 400 through relays 300 and 310. The battery system 100 is connected to a battery charger 420 through relays 320 and 330. The battery system 100 includes an assembled battery 110, a cell battery manager 120, an electric current detector 130, an electric voltage detector 140, an assembled battery controller 150, and a storage unit 180.

The assembled battery 110 is implemented by a plurality of cell batteries 111. The cell battery manager 120 monitors the state of the cell batteries 111. The electric current detector 130 detects the electric current flowing through the battery system 100. The electric voltage detector 140 detects the total voltage of the assembled battery 110. The assembled battery controller 150 controls the assembled battery 110.

The assembled battery controller 150 receives: battery voltages or battery temperatures of the cell battery 111 transmitted by the cell battery manager 120; a value of electric current flowing through the battery system 100 transmitted by the electric current detector 130; and a value of total voltage of the assembled battery 110 transmitted by the electric voltage detector 140. The assembled battery controller 150 detects the state of the assembled battery 110 according to the received information. The result of state detection by the assembled battery controller 150 is sent to the cell batter manager 120 or to the vehicle controller 200.

The assembled battery 110 is implemented by serially connecting a plurality of the cell batteries 111 electrically that are capable of charging and discharging electric energy (charge and discharge of direct current power). The cell batteries 111 implementing the assembled battery 110 are grouped into a predetermined unit number of cell batteries for managing and controlling the states of the cell batteries 111. The grouped cell batteries 111 are serially connected electrically, thereby implementing cell battery groups 112a and 112b. The number of the cell batteries 111 implementing the cell battery group 112 may be the same for all of the cell battery groups 112 or may be different for each of the cell battery groups 112.

The cell battery manager 120 monitors the state of the cell battery 111 implementing the assembled battery 110. The cell battery manager 120 includes a cell battery controller 121 that is provided for each of the cell battery group 112. In FIG. 1, the cell battery controllers 121a and 121b are provided that correspond to the cell battery groups 112a and 112b. The cell battery controller 121 monitors and controls the state of the cell battery 111 implementing the cell battery group 112.

In the embodiment 1, for the sake of simplicity of description, four units of the cell batteries 111 are serially connected electrically to implement the cell battery groups 112a and 112b, and the cell battery groups 112a and 112b are further serially connected electrically, thereby implementing the assembled battery 110 including eight units of the cell batteries 111.

The assembled battery controller 150 and the cell battery manager 120 send and receive signals through signal communication means 160 and an insulating element 170 such as photo coupler.

Hereinafter, the communication means will be described which is provided between the assembled battery controller 150 and the cell battery controllers 121a and 121b implementing the cell battery manager 120. The cell battery controllers 121a and 121b are serially connected in descending order of electric potential of the cell battery groups 112a and 112b monitored by the cell battery controllers 121a and 121b respectively. The signal sent from the assembled battery controller 150 to the cell battery manager 120 is inputted into the cell battery controller 121a through the insulating element 170a and through the signal communication means 160. The output from the cell battery controller 121a is inputted into the cell battery controller 121b through the signal communication means 160. The output of the cell battery controller 121b at the lowest order is transmitted to the assembled battery controller 150 through the insulating element 170 and through the signal communication means 160. In the embodiment 1, the insulating element 170 is not provided between the cell battery controllers 121a and 121b. However, the cell battery controllers 121a and 121b may send and receive signals between each other through the insulating element 170.

The storage unit 180 stores information of the assembled battery 150, of the cell battery 111, and of the cell battery group 112, such as internal resistances, capacitances in fully charged state, polarization voltages, deterioration characteristics, individual difference information, or relationships between SOC and open circuit voltage (OCV). The storage unit 180 may further store characteristic information of the cell battery manager 120, of the cell battery controller 121, and of the assembled battery controller 150. The information stored in the storage unit 180 will be described later with reference to FIG. 4. In the embodiment 1, the storage unit 180 is provided at outside of the assembled battery controller 150 or of the cell battery manager 120. However, the assembled battery controller 150 or the cell battery manager 120 may include the storage unit and the information above may be stored in the storage unit.

Using information received from the cell battery manager 120, from the electric current detector 120, from the electric voltage detector 130, or from the vehicle manager 200, or using information stored in the storage unit 180, the assembled battery controller 150 calculates SOCs, state of health (SOH), chargeable or dischargeable electric currents or electric power, abnormal states, or amounts of charge or discharge of one or more of the cell battery 111. The calculated results are transmitted to the cell battery manager 120 or to the vehicle controller 200.

Using the information sent by the assembled battery controller 150, the vehicle controller 200 controls the inverter 400 connected with the battery system 100 through the relays 300 and 310. The vehicle controller 200 further controls the battery charger 420 connected with the battery system 100 through the relays 320 and 330. While the vehicle is running, the battery system 100 is connected with the inverter 400 and uses the energy stored in the assembled battery 110 to drive the motor generator 410. While the vehicle is charged, the battery system 100 is connected with the battery charger 420 and is charged by electric power supply from electric power sources for home use or from electric power stations.

The battery charger 420 is used when charging the assembled battery 110 using external power sources such as those at home or at power charge station. In the embodiment 1, the battery charger 420 controls the charging voltage or the charging current according to instructions from the vehicle controller 200. However, the battery charger 420 may control them according to instructions from the assembled battery controller 150. The battery charger 420 may be installed within the vehicle or may be installed at outside of the vehicle depending on the performance of the battery charger 420, on the purpose of the battery charger 420, or on the install condition of the external power sources.

Under the control of the vehicle controller 200, the battery system 100 is connected to the inverter 400 and drives the motor generator 410 using the energy stored in the assembled battery 110 when the vehicle system equipping the battery system 100 runs, and the assembled battery 110 is charged by the generated power of the motor generator 410 in regeneration. When the vehicle equipping the battery system 100 is connected with external power sources such as those at home or at power stations, the battery system 100 is connected with the battery charger 420 according to the information sent from the vehicle controller 200, and the assembled battery 110 is charged up to a predetermined condition. The energy stored by the charge operation into the assembled battery 110 is utilized in the next run of the vehicle or in driving electric equipments within or outside of the vehicle. If necessary, the energy may be further extracted to external power sources such as home power sources.

Figure 2:
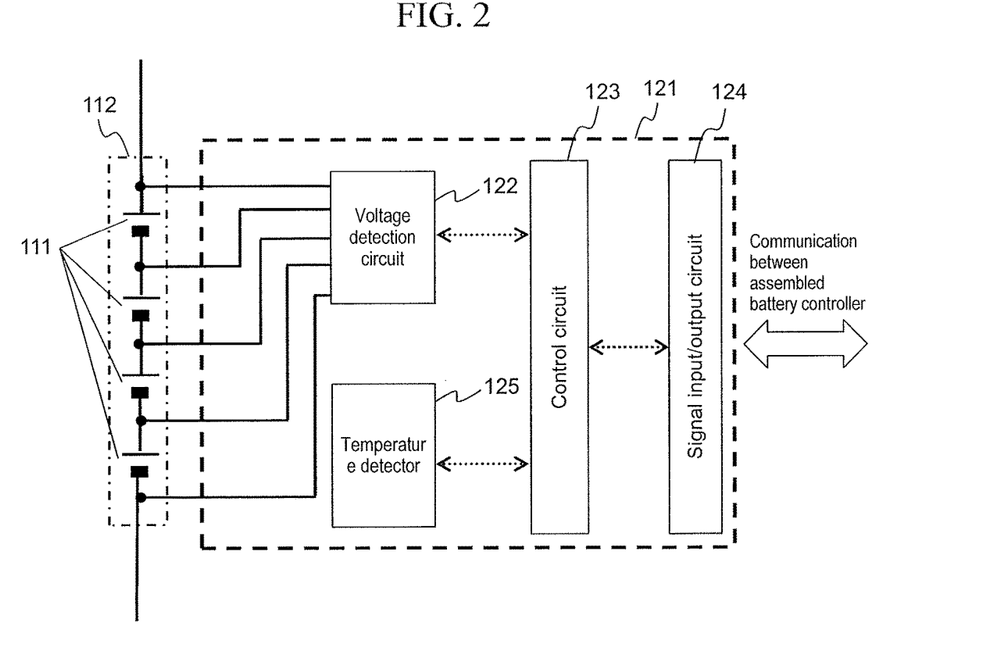
FIG. 2 is a diagram showing a circuit configuration of a cell battery controller 121.

FIG. 2 is a diagram showing a circuit configuration of the cell battery controller 121. The cell battery controller 121 includes a voltage detection circuit 122, a control circuit 123, a signal input/output circuit 124, and a temperature detector 125. The voltage detection circuit 122 measures a voltage between both ends of each of the cell batteries 111. The control circuit 123 receives measured results from the voltage detection circuit 122 and from the temperature detector 125, and transmits the received results to the assembled battery controller 150 through the signal input/output circuit 124. A circuit configuration for equalizing variations of voltages or SOCs between the cell batteries 111 that may occur due to self discharge or due to variations in consumption currents is typically implemented in the cell battery controller 121. However, such circuit configurations may be commonly known and thus are omitted in the figure.

The temperature detector 125 included in the cell battery controller 121 has a functionality for measuring the temperature of the cell battery group 112. The temperature detector 125 measures one temperature of the cell battery group 112 as a whole and handles the measured temperature as a representative temperature of the cell batteries 111 implementing the cell battery group 112. The temperature measured by the temperature detector 125 is used in various calculations for detecting states of the cell battery 111, of the cell battery group 112, or of the assembled battery 110. Since FIG. 2 assumes such configurations, one unit of the temperature detector 125 is provided in the cell battery controller 121. It is possible to provide the temperature detector 125 for each of the cell batteries 111 to measure the temperature of each of the cell batteries. However, since the number of the temperature detector 125 is increased in that case, the configuration of the cell battery controller 121 is complicated.

In FIG. 2, the temperature detector 125 is shown in a simplified manner. However, in actual configurations: a temperature sensor is provided for the temperature measurement target; the provided temperature sensor outputs temperature information as a voltage; the voltage is detected and is transmitted to the signal input/output circuit 124 through the control circuit 123; and the signal input/output circuit 124 outputs the measured result to outside of the cell battery controller 121. A functionality performing this process flow may be implemented as the temperature detector 125 in the cell battery controller 121, and the measurement of the temperature information (voltage) may be performed by the voltage detection circuit 122.

The configuration of the battery system 100 has been described thus far. Next, a method for verifying the SOC of the cell battery 111, of the cell battery group 112, or of the assembled battery 110 calculated by the battery system 100 will be described.

Embodiment 1

Overview of Method for Verifying SOC

Figure 3:
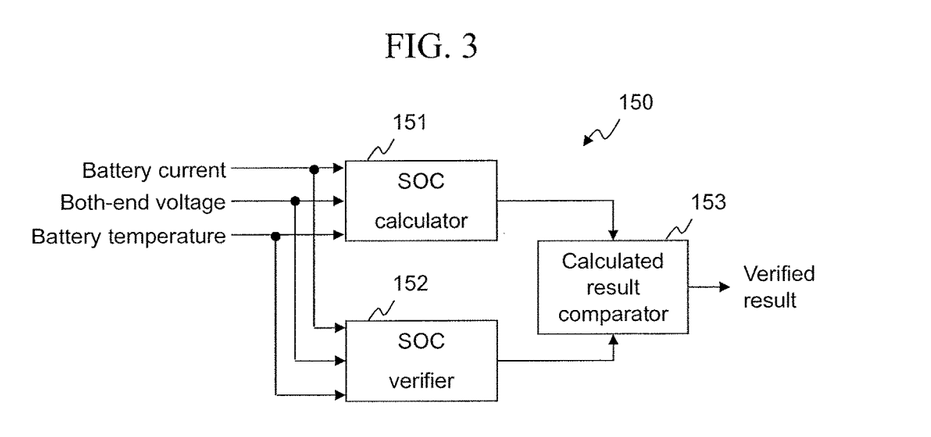
FIG. 3 is a functional block diagram of an assembled battery controller 150.

FIG. 3 is a functional block diagram of the assembled battery controller 150. The assembled battery controller 150 controls each battery according to the calculated result of SOC of the cell battery 111, of the cell battery group 112, or of the assembled battery 110. Hereinafter, for the sake of simplicity of description, SOC of the cell battery 111 is calculated and is converted into SOC of the cell battery group 112 or into SOC of the assembled battery 110 if necessary. However, the present invention is not limited to such configuration.

The assembled battery controller 150 includes a SOC calculator 151, a SOC verifier 152, and a calculated result comparator 153.

The SOC calculator 151 calculates SOC of the cell battery 111 using: battery currents detected by the electric current detector 130; voltage between both ends of battery detected by the voltage detection circuit 122; and if necessary battery temperatures detected by the temperature detector 125. The sequence of calculation will be described later. The SOC verifier 152 receives the same detected results as those of the SOC calculator 151, and calculates SOC of the cell battery 111 using a calculating method different from that of the SOC calculator 151. The calculated result comparator 153 compares the calculated result of the SOC calculator 151 with the calculated result of the SOC verifier 152. If the difference between both of the calculated results is at or below a predetermined threshold, the calculated result comparator 153 determines that the calculated result of the SOC calculator 151 is valid. Otherwise the calculated result comparator 153 reports, for example, an error to upper systems. The threshold may be stored in the storage unit 180 in advance, for example. The frequency of determination for the calculated result may not be once. For example, if the determination results in error consecutively for a predetermined times or the sum of frequency of determinations resulting in error reaches a predetermined threshold, the calculated result comparator 153 may report the error.

By mutually comparing the calculated result of the SOC calculator 151 with the calculated result of the SOC verifier 152, it is possible to verify the validity of the calculated result of SOC. Accordingly, even if the calculating method employed by the SOC calculator 151 may not be perfect, it is possible to secure the accuracy of calculated result by verifying the calculated result using another calculating method together.

The overview of verifying the SOC has been described thus far. Hereinafter, the methods for the SOC calculator 151 and for the SOC verifier 152 to calculate SOCs will be described.

Embodiment 1

Method for Calculating SOC

The embodiment 1 describes SOCi method, SOCv method, and IV method as methods for calculating SOC. The SOC calculator 151 uses any one of these calculating methods or uses two or more of these calculating methods together to calculate SOC. The SOC verifier 152 calculates SOC using a calculating method that is not in use by the SOC calculator 151. Hereinafter, a SOC table which is common for these methods will be described at first. Then each of the methods will be described.

(Example of SOC Table)

Figure 4:
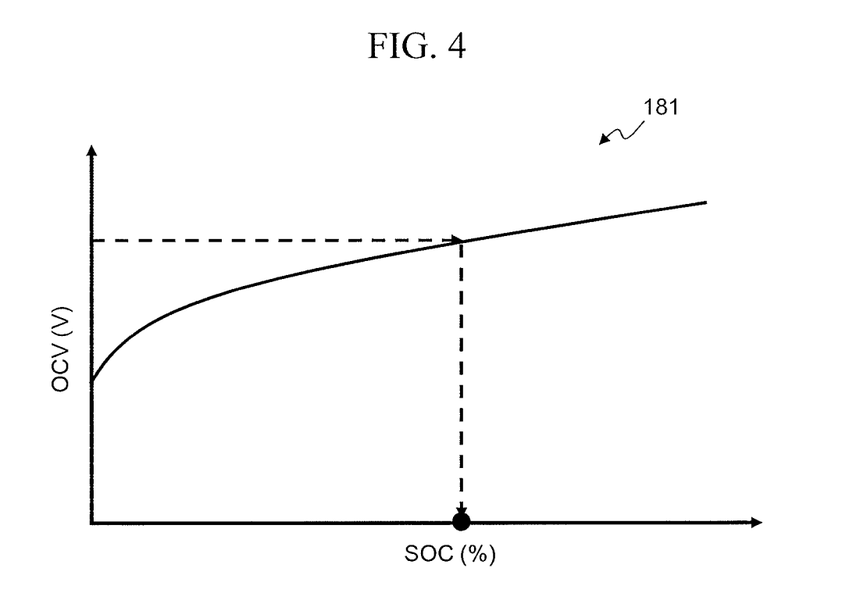
FIG. 4 is a diagram showing an example of a SOC table 181 that is stored in a storage unit 180.

FIG. 4 is a diagram showing an example of a SOC table 181 that is stored in the storage unit 180. The SOC table 181 is a data table that describes a relationship between an OCV of the cell battery 111 and a SOC of the cell battery 111. Any data format may be used. For the sake of simplicity of description, the data example will be described with graph formats. Although the embodiment 1 uses data table, the relationship between OCV and SOC may be described using such as equations. Any means may be used as long as that corresponds to characteristic information indicating the relationship between OCV and SOC and that is capable of converting from OCV to SOC or from SOC to OCV.

OCV is an electric voltage of the cell battery 111 when there is no load. At the time before the relays 300, 310, 320, and 330 are closed, or at the time when the relays 300, 310, 320, and 330 are closed but charge or discharge of the assembled battery 110 has not been started, the voltage between both ends of the cell battery 111 may be deemed as OCV. In addition, if the assembled battery 110 is being charged or discharged but the electric current is very small, the voltage may be deemed as OCV.

(Method for Calculating SOC: SOCi Method)

A method is known for calculating SOC, in which: an initial OCV of the cell battery 111 included in the battery system 100 is measured and is converted into SOC by referring to the SOC table 181 (SOC0); the electric current flowing into or from the cell battery 111 is integrated ($\int I(t)dt$) and then is divided by the maximum charge capacity (Qmax) of the cell battery 111, thereby calculating the difference of SOC ($\Delta SOC(t)$) from the initial SOC (SOC0); and SOC is acquired according to SOC0 and the difference of SOC ($\Delta SOC(t)$). This method is referred to as SOCi method in this document. SOCi method is described as Equation 1 below.

$$SOCi(t)=SOC0+\Delta SOC(t) \quad \text{Equation 1}$$

SOC0=Map(OCV)
$\Delta SOC(t)=100\times\int I(t)dt/Qmax$

SOC of each of the cell batteries 111 can be acquired by performing the calculation for each of the cell batteries 111. An average of SOC of the cell batteries 111 can be acquired by performing the calculation for the assembled battery 110 as a whole. The value of Qmax may be gradually corrected using the state of health (SOH) of the cell battery 111.

(Method for Calculating SOC: SOCv Method)

If the electric current flowing into or from the cell battery 111 is large, the internal resistance in the cell battery 111 causes non-negligible voltage drops or voltage rises. The battery voltage at this time is a closed circuit voltage (CCV). Under this condition, it is difficult for the cell battery controller 121 to directly identify OCV of the cell battery 111. In order to acquire OCV in this case, it is necessary for the assembled battery controller 150 to calculate OCV according to Equation 2 below using: CCV of the cell battery 111 measured by the cell battery controller 121; the electric current I flowing into or from the cell battery 111 measured by the electric current detector 130; the internal resistance R of the cell battery 111 stored in the storage unit 180 in advance; and information about the polarization voltage Vp.

The assembled battery 150 may execute the calculation of Equation 2 below regardless of whether the cell battery 111 is being charged or discharged. SOC is calculated for each of the cell batteries 111 using such as OCV of each of the cell batteries 111 in the assembled battery 110.

$$OCV=CCV-I\times R-Vp \quad \text{Equation 2}$$

The assembled battery controller 150 may acquire SOC of the cell battery 111 by using CCV of the cell battery 111 detected by the cell battery controller 121 and using the SOC table 181. The assembled battery controller 150 may also calculate OCV of the assembled battery 110 by summing OCVs of the cell batteries 111. If SOC characteristics are different for each of the cell batteries 111, the SOC table 181 may be provided for each of the cell batteries 111.

In the calculating methods above, it is necessary to previously store calculation parameters such as the maximum charge capacity in the storage unit 180 for each of the cell batteries 111.

(Method for Calculating SOC: IV Method)

Figure 5:
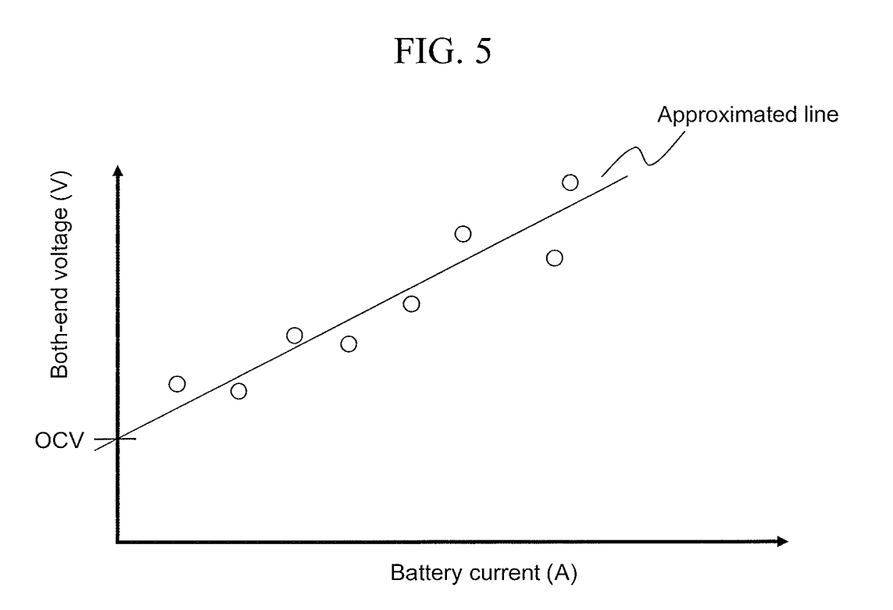
FIG. 5 is a diagram showing an overview of IV method.

FIG. 5 is a diagram showing an overview of IV method. After measuring the battery current flowing through the cell battery 111 and measuring the voltage between both ends of the cell battery 111 for a plurality of times, the measured results may be plotted on a 2-dimensional plane as shown in FIG. 5. The assembled battery controller 150 may acquire OCV by calculating an approximated line indicating the correlation between the battery current and the both-end voltage using the measured results, and by calculating the voltage between both ends when the battery current is 0 (i.e. open circuit voltage). After acquiring OCV, the SOC at that time may be acquired using the SOC table 181.

Embodiment 1

Summary

As discussed thus far, the battery system 100 according to the embodiment 1 may, by calculating SOC using a calculating method that is not in use by the SOC calculator 151, mutually verify SOCs calculated by using a plurality of calculating methods.

Embodiment 2

The embodiment 1 describes that the SOC calculator 151 uses one of the three calculating methods. In an embodiment 2 of the present invention, a specific operational example will be described in which: the SOC calculator 151 uses SOCi method and SOCv method together with weight factors; and the SOC verifier 152 verifies SOC using IV method or one of SOCi method or SOCv method with smaller one of the weight factor used by the SOC calculator 151. Other configurations of the battery system 100 are the same as those of the embodiment 1.

Figure 6:
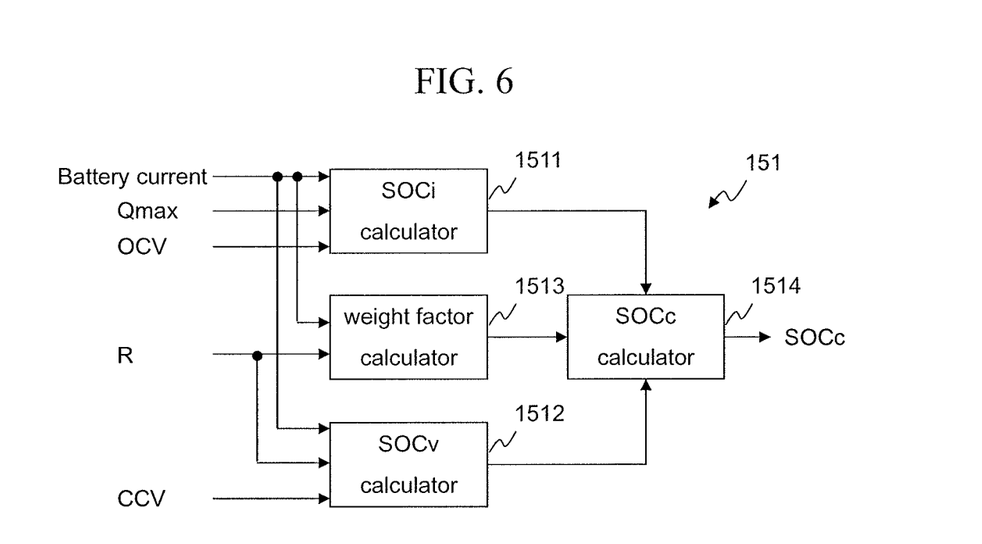
FIG. 6 is a functional block diagram of a SOC calculator 151 in an embodiment 2.

FIG. 6 is a functional block diagram of the SOC calculator 151 in the embodiment 2. In the embodiment 2, the SOC calculator 151 outputs SOCc as a final calculated result of SOC by adding the calculated result of SOCi method and the calculated result of SOCv method with weight factors.

The SOC calculator 151 includes a SOCi calculator 1511, a SOCv calculator 1512, a weight factor calculator 1513, and a SOCc calculator 1514. The SOCi calculator 1511 and the SOCv calculator 1512 calculate SOCs using SOCi method and SOCv method described in the embodiment 1 respectively. The calculated results are outputted to the SOCc calculator 1514.

The weight factor calculator 1513 calculates a weight factor W using Equation 3 below. In other words, as the battery current I flowing through the cell battery 111 is increased, the weight factor W is decreased. As I is decreased, the weight factor W is increased. R is an internal resistance of the cell battery 111.

$$W=1/(1+I\times R) \quad \text{Equation 3}$$

The SOCc calculator 1514 calculates SOCc by adding the calculated result SOCi of the SOCi calculator 1511 and the calculated result SOCv of the SOCv calculator 1513 with weight factors using Equation 4 below. In other words, as the battery current I is increased, the weight factor W is decreased and thus the proportion of SOCi is increased. As I is decreased, the weight factor W is increased and thus the proportion of SOCv is increased.

$$SOCc = W \times SOCv + (1-W) \times SOCi \qquad \text{Equation 4}$$

Figure 7:
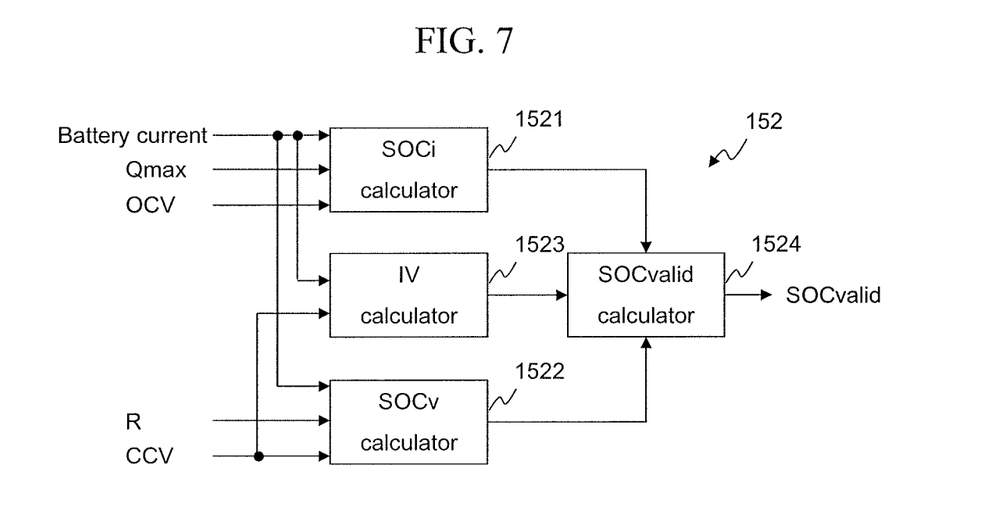
FIG. 7 is a functional block diagram of a SOC verifier 152 in the embodiment 2.

FIG. 7 is a functional block diagram of the SOC verifier 152 in the embodiment 2. The SOC verifier 152 includes a SOCi calculator 1521, a SOCv calculator 1522, an IV calculator 1523, and a SOCvalid calculator 1524. In the embodiment 2, the SOC verifier 152 calculates SOCvalid as a SOC for verification purpose by using calculating methods that are not in use by the SOC calculator 151.

(Period when SOCi and SOCv are Used Together)

In the period when the SOC calculator 151 uses SOCi method and SOCv method together, the IV calculator 1523 calculates SOC using IV method described in the embodiment 1. Specifically, in the period when the weight factor W is between the two thresholds described below, it can be determined that the SOC calculator 151 is using SOCi method and SOCv method together. The SOCvalid calculator 1524 employs SOC calculated by IV method as SOCvalid.

(Period when Proportion of SOCv is Large)

As the battery current I becomes small, the weight factor W is increased. Thus the proportion of SOCv in Equation 4 is increased. When the weight factor W becomes larger than some extent, it can be determined that SOCc is calculated by using SOCv method only substantially. Then the SOCvalid calculator 1524 employs the result of SOCi method calculated by the SOCi calculator 1521 as SOCvalid in the period when the weight factor W is above a predetermined threshold.

(Period when Proportion of SOCi is Large)

As the battery current I becomes large, the weight factor W is decreased. Thus the proportion of SOCv in Equation 4 is increased. When the weight factor W becomes smaller than some extent, it can be determined that SOCc is calculated by using SOCi method only substantially. Then the SOCvalid calculator 1524 employs the result of SOCv method calculated by the SOCv calculator 1522 as SOCvalid in the period when the weight factor W is below a predetermined threshold. This threshold may be different from the threshold for determining whether SOCi method is employed for verification.

(Period when Proportion of SOCi is Large: Additional Note)

Equation 2 that is used when SOCv method is used includes the internal resistance R and the polarization voltage Vp. These values may fluctuate due to factors such as temperatures. Thus the calculated result of SOCv method could be less accurate than that of SOCi method. Therefore, when using SOCv method for verification, IV method may also be used together. For example, it is conceivable in this period that the SOCv calculator 1522 and the IV calculator 1523 calculate SOC respectively, and that any one of them which is within a predetermined range from the prior SOCvalid will be employed. The reason of above is: if the accuracy of the calculated result is low, the currently calculated result of SOCvalid is diverged and thus is much departed from the prior calculated result.

Embodiment 2

Summary

As discussed thus far, the battery system 100 according to the embodiment 2 calculates SOC by adding the calculated result of SOCi method and the calculated result of SOCv with weight factors. The battery system 100 verifies SOC using a calculating method that is different from that of the SOC calculator 151 depending on the weight factor. Accordingly, it is possible to verify SOC using calculating methods as accurate as possible. Thus it is possible to improve the verification accuracy.

Embodiment 3

IV method described in the embodiment 1 may not be appropriate for verification purpose depending on the condition. Thus in an embodiment 3 of the present invention, a condition will be described where the SOC verifier 152 does not perform verification using IV method. In such periods, the verification may be performed using methods other than IV method regardless of whether the period corresponds to the periods described in the embodiment 2. Alternatively, the verification may be temporarily suspended.

(Condition for not Using IV Method No. 1: Duration of Energization)

When the time for which the cell battery 111 is energized continues to some extent, the internal resistance R of the cell battery 111 varies and the accuracy of the approximated line described in FIG. 5 is decreased. Thus the SOC verifier 152 does not perform verification using IV method if the duration of energization of the cell battery 111 is at or above a predetermined threshold when attempting to verify SOC.

(Condition for not Using IV Method No. 2: Battery Temperature)

When the temperature of the cell battery 111 becomes low to some extent, the internal resistance R of the cell battery 111 varies significantly and the accuracy of the approximated line described in FIG. 5 is decreased. Thus the SOC verifier 152 does not perform verification using IV method if the temperature of the cell battery 111 is at or below a predetermined threshold when attempting to verify SOC.

(Condition for not Using IV Method No. 3: Plot Width)

As described with reference to FIG. 5, if values of the battery current are concentrated within a near range when acquiring the battery current and the both-end voltage for a plurality of times, it may not be possible to precisely calculate the approximated line. Thus the SOC verifier 152 does not perform verification using IV method if the range width of the battery current is at or below a predetermined threshold when attempting to verify SOC.

(Condition for not Using IV Method No. 3: Plot Width: Additional Note)

Figure 8:
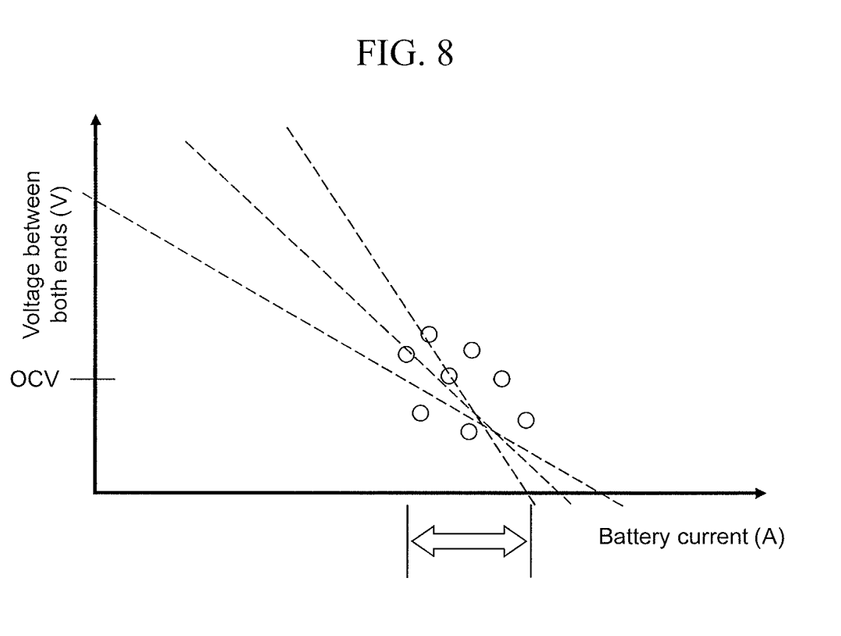
FIG. 8 is a diagram in which a battery current and a voltage between both ends are plotted when a plotting width is insufficient.
Figure 9:
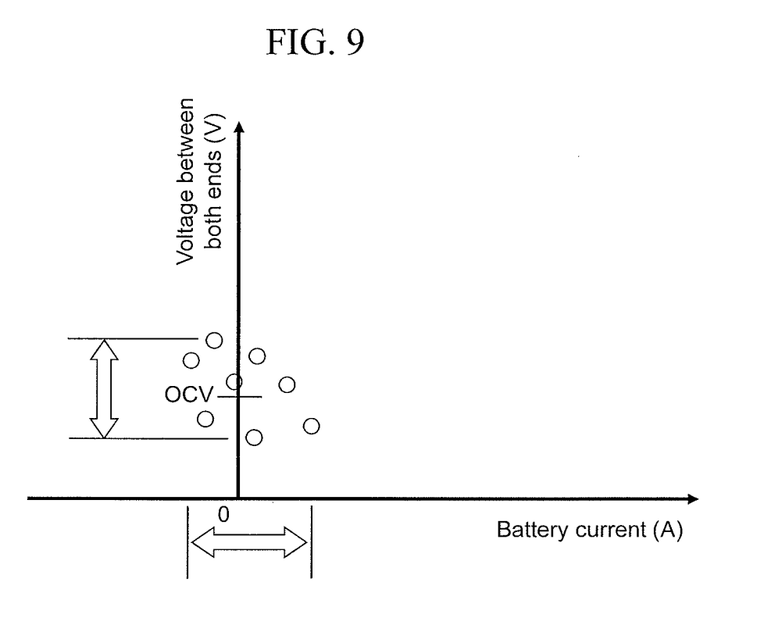
FIG. 9 is a diagram showing a case where a battery currents are concentrated around 0 (A).

FIG. 8 is a diagram in which a battery current and a voltage between both ends are plotted in a case of this condition. Since the battery currents are concentrated within a narrow range, it is difficult to precisely calculate the approximated line. In this case, the SOC verifier 152 does not perform verification using IV method. However, if the battery currents are concentrated around 0 (A) as shown in FIG. 9, it may be possible to employ, as an approximated OCV, an average value or a center value of the both-end voltage in each of the plots.

(Condition for not Using IV Method No. 4: Amount of SOC Variation)

Figure 10:
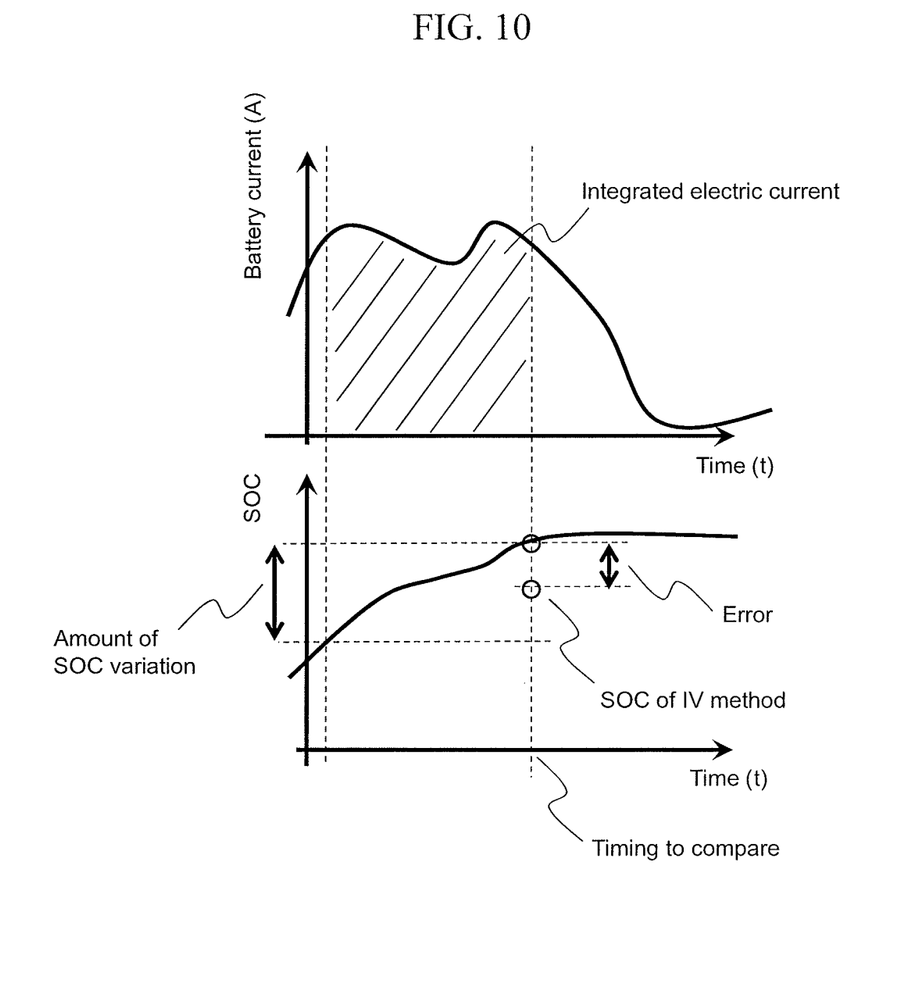
FIG. 10 is a diagram showing that SOC of battery varies if a battery current flows while acquiring SOC.

The SOC calculated in IV method is an intercept of the approximated line, i.e. OCV, and thus only one value of SOC may be acquired. This SOC may be handled as a representative value of SOC of battery during the battery current and the both-end voltage are acquired. The SOC of battery may fluctuate if a battery current flows while acquiring these values. The difference between SOC after the variation and the SOC calculated in IV method could be an error of SOC in IV method. FIG. 10 shows such a situation. As the amount of SOC variation becomes large, the error also becomes large. The amount of SOC variation is proportional to the integral value of the battery current that flowed while acquiring the current. Thus the SOC verifier 152 does not perform verification using IV method if the integrated current of battery is at or above a predetermined threshold when attempting to verify SOC.

The invention of the inventors has been described in details according to the embodiments. However, the present invention is not limited to the embodiments, and may be variously modified within the spirits of the present invention.

The configurations, the functions, the processing units, the processing means, etc., may be realized by hardware such as by designing part or all of the components by an integrated circuit. A processor may interpret and execute programs for realizing the functions to realize the configurations, the functions, etc., by software. Information, such as programs, tables, and files, for realizing the functions can be stored in a recording device, such as a memory, a hard disk, and an SSD (Solid State Drive), or in a recording medium, such as an IC card, an SD card, and a DVD.

REFERENCE SIGNS LIST

100: battery system
110: assembled battery
111: cell battery
112: cell battery group
120: cell battery manager
121: cell battery controller
122: voltage detection circuit
123: control circuit
124: signal input/output circuit
125: temperature detector
130: electric current detector
140: electric voltage detector
150: assembled battery controller
160: signal communication means
170: insulating element
180: storage unit
181: SOC table
200: vehicle controller
300-330: relay
400: inverter
410: motor generator
420: battery charger

The invention claimed is:

1. A battery control device comprising:
a charge state calculator that implements a first sequence for calculating a state of charge of a battery;
a controller that controls the battery according to a calculated result of the charge state calculator; and
a charge state verifier that verifies the calculated result of the charge state calculator by calculating the state of charge of the battery using a second sequence which is different from the first sequence;
wherein the charge state calculator calculates the state of charge using a plurality of sequences together as the first sequence,
wherein the charge state verifier implements a plurality of sequences as the second sequence,
and wherein the charge state verifier verifies the calculated result of the charge state calculator by calculating the state of charge of the battery using a sequence that is not in use by the charge state calculator.

2. The battery control device according to claim 1,
wherein the charge state verifier performs the verification using a calculated result of the IV method if the weight factor is within a predetermined range.

3. The battery control device according to claim 1,
wherein the charge state calculator configures the weight factor so that a sum of a weight of the SOCv method and a weight of the SOCi method is 1,
wherein the charge state calculator configures the weight factor so that the weight of the SOCi method becomes larger as an electric current flowing through the battery in increased,
and wherein if the weight of the SOCi method is over a predetermined value, the charge state verifier calculates a calculated result of the IV method and a calculated result of the SOCv method respectively, and performs the verification using one of the calculated result which is not diverged.

4. The battery control device according to claim 1,
wherein the charge state calculator configures the weight factor so that a sum of a weight of the SOCv method and a weight of the SOCi method is 1,
wherein the charge state calculator configures the weight factor so that the weight of the SOCi method becomes larger as an electric current flowing through the battery in increased,
and wherein if the weight of the SOCv method is over a predetermined value, the charge state verifier performs the verification using a calculated result of the SOCi method.

5. The battery control device according to claim 1,
wherein if a time for which an electric current flows continuously through the battery is at or over a predetermined time when estimating a relationship between the electric current and the both-end voltage, the charge state verifier does not perform the verification using the IV method.

6. The battery control device according to claim 1,
wherein if a temperature of the battery is at or below a predetermined temperature when estimating a relationship between the electric current and the both-end voltage, the charge state verifier does not perform the verification using the IV method.

7. The battery control device according to claim 1,
wherein if a value range acquired in measuring an electric current flowing through the battery is at or below a predetermined range when estimating a relationship between the electric current and the both-end voltage, the charge state verifier does not perform the verification using the IV method.

8. The battery control device according to claim 1,
wherein if a value range acquired in measuring an electric current flowing through the battery is at or below a predetermined range and if an average value or a center value of the measured electric current is approximately 0 ampere when estimating a relationship between the electric current and the both-end voltage, the charge state verifier employs an average value or a center value of the both-end voltage as an estimated result of the open circuit voltage.

9. The battery control device according to claim 1,
wherein the charge state verifier integrates a measured electric current flowing through the battery when estimating a relationship between the electric current and the both-end voltage, and wherein if the integrated result is at or above a predetermined value, the charge state verifier does not perform the verification using the IV method.

10. A battery system comprising:
a battery control device according to claim 1; and
an assembled battery in which a plurality of cell batteries is connected,
wherein the battery control device controls the cell battery or the assembled battery.

* * * * *